Figure 1:
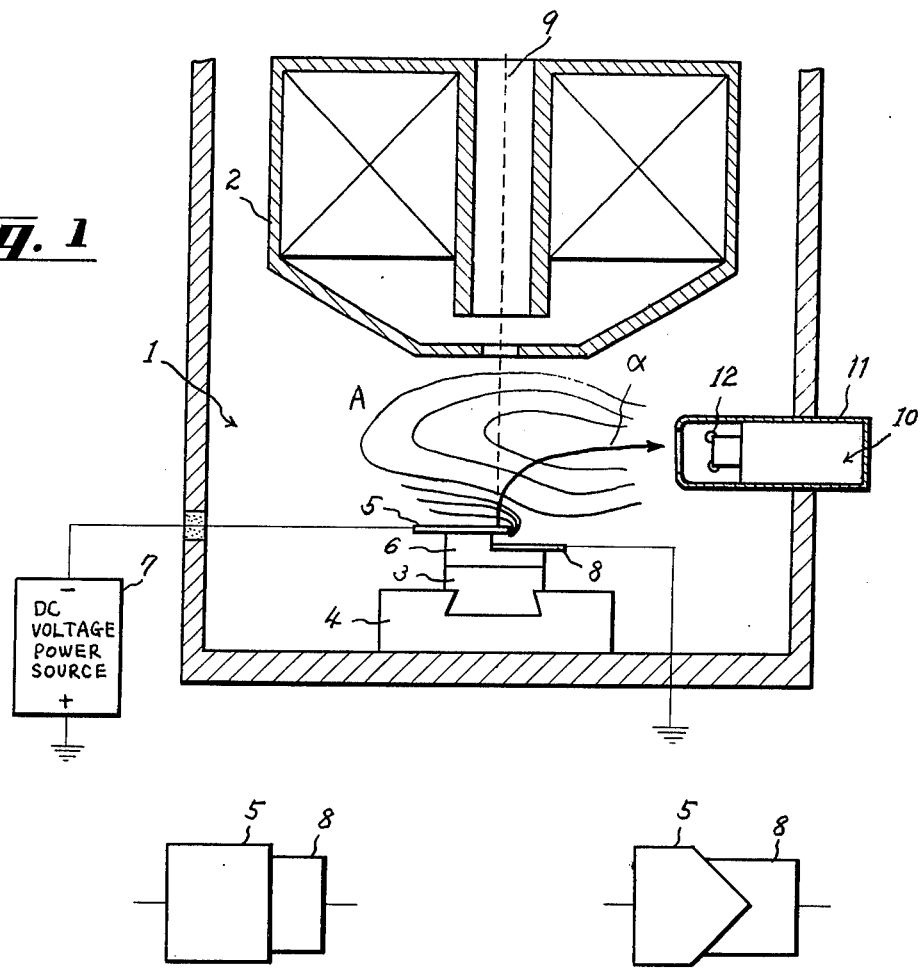

United States Patent [19]

Tagawa et al.

[11] 4,011,450
[45] Mar. 8, 1977

[54] SCANNING ELECTRON DEVICE

[75] Inventors: Takashi Tagawa, Nara; Jun-Ichi Mori, Uji, both of Japan

[73] Assignees: Nihon Denshi Kabushiki Kaisha, Tokyo; Unitika Ltd., Hyogo, both of Japan

[22] Filed: May 16, 1975

[21] Appl. No.: 577,989

[30] Foreign Application Priority Data

July 17, 1974 Japan .............................. 49-81952

[52] U.S. Cl. .............................................. 250/311
[51] Int. Cl.$^2$ ................... G21K 7/00; G01N 23/00; H01K 37/26
[58] Field of Search ........... 250/311, 309, 308, 305

[56] References Cited

UNITED STATES PATENTS 3,792,263  11/1975  Hashimoto ........................ 250/311

Primary Examiner—Alfred E. Smith
Assistant Examiner—T. N. Grigsby
Attorney, Agent, or Firm—Webb, Burden, Robinson & Webb

[57] ABSTRACT

A scanning electron device having means for creating an electric field for directing secondary electrons to a detecting means comprising auxiliary electrodes and power supplies therefor so as to increase both the output signal intensity and contrast obtained by the electron detector. The field is created by two or more auxiliary electrodes, said specimen being located near the lowest potential electrode.

4 Claims, 10 Drawing Figures

*Fig. 2*    *Fig. 4*

SCANNING ELECTRON DEVICE

This invention relates to an apparatus associated with a scanning electron microscope or the like, more particularly, to an apparatus for effectively collecting secondary electrons emanated from a specimen caused by primary electron beam irradiation.

It is important to produce a strong, high contrast signal in order to obtain a high resolution scanning image. For this purpose, the collector electrode forming part of the secondary electron detecting means of an ordinary scanning electron microscope is maintained at a positive potential with respect to the specimen. The electric field surrounding the collector electrode generally directs secondary electrons near the detector to the detector where they are detected. However, in the prior art, the electric field near the specimen surface is not strong enough to accelerate a sufficient number of electrons towards the electron detector. Accordingly, the secondary electron detection rate is less than desired. This factor is all the more pronounced when the specimen is orientated in the horizontal plane, i.e., at right angles with respect to the primary electron beam.

Image contrast (directly related to detector signal amplitude) is mainly determined by the difference in the quantity of the secondary electrons emanated from the different surfaces of the specimen. Contrast is based on the fact that the quantity of the secondary electrons emanated from the specimen varies according to the degree of topographical incline at each micro-area of the specimen surface. Further, the collection rate remains almost the same regardless of the direction of the emitted secondary electrons. Hence, it is difficult to obtain high signal contrast with the type of electron detecting means currently used in scanning electron microscopes of the prior art.

It is, therefore, an object of this invention to provide an apparatus for effectively detecting the secondary electrons emanated from the surface of a specimen.

Another object of this invention is to enhance the amplitude variation of the signal output of the detector attributable to unevenness of the specimen surface.

Briefly stated, in order to obtain a high contrast, strong intensity signal, this invention provides two or more auxiliary electrodes located generally in the vicinity of the specimen and the electron detecting means. The detector is equipped with a collector electrode for drawing the secondary electrons toward the detector. A power supply applies potentials to the auxiliary electrodes. The specimen is either located near the auxiliary electrode maintained at the lowest potential, or the specimen itself is used as an auxiliary electrode in which case the specimen is kept at the lowest potential. The auxiliary electrodes, made from metal or a plastic material possessing some electrical conductance, are arranged in the specimen chamber of the scanning electron microscope and secured by means of insulating members. The orientation of the auxiliary electrodes and specimen is determined according to the shape of the specimen chamber, position of the electron detector and the shape, type, and size of the specimen so as to create an electric field near the specimen for accelerating secondary electrodes toward the detector.

In the embodiments disclosed herein, when one electrode of the two or more auxiliary electrodes is maintained at ground potential and the specimen is located near the lowest (minus) potential electrode, a strong electron detector output signal is obtained. Further, if the potential of the lowest potential electrode is decreased from −10V to −4kV, the signal output of the electron detector is also increased by several hundreds percent. Although, in this case, the path of the primary electron beam accelerated voltage of several kV to several hundred kV is shifted slightly by the electric field produced by the auxiliary electrodes, the focussing efficiency of the condenser lens is not affected. In fact, a scanning image having a magnification of 30 ~60,000 × can be obtained without any ill effects of the above nature being discernible.

In this specification, the expression "scanning electron microscope" can be taken to include X-ray microanalyzers or conventional transmission type electron microscopes incorporating means for displaying a scanning image of the secondary electrons emanated from the specimen by primary electron beam irradiation.

Figure 3:
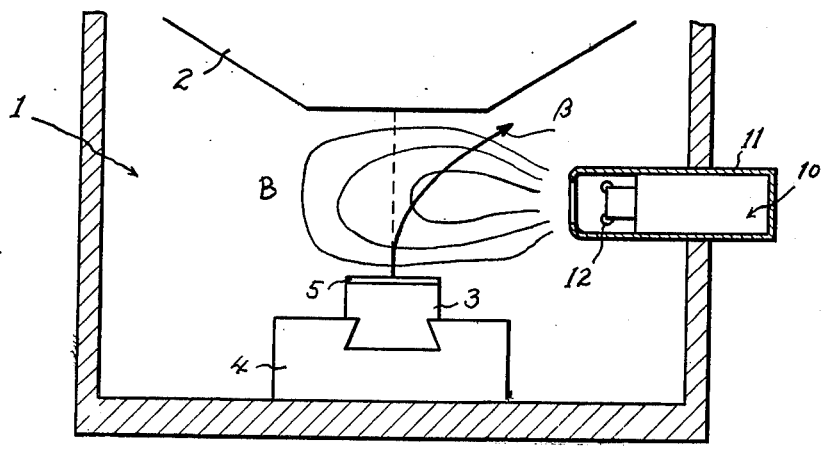
Figure 5:
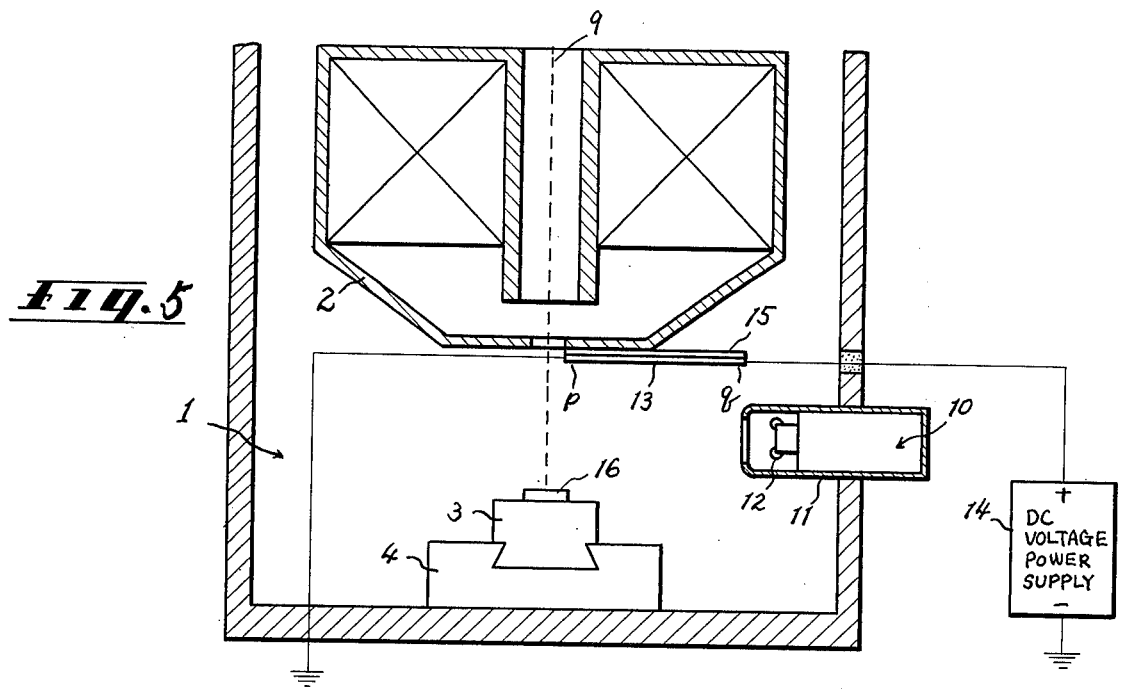
Figure 6:
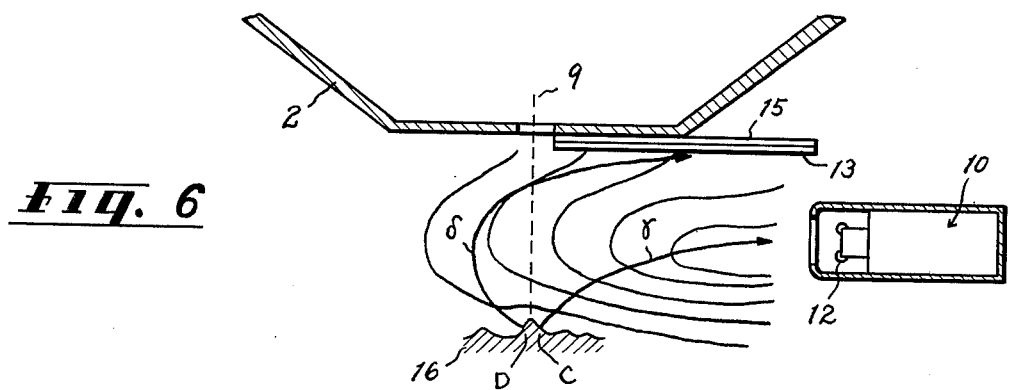
Figure 8:
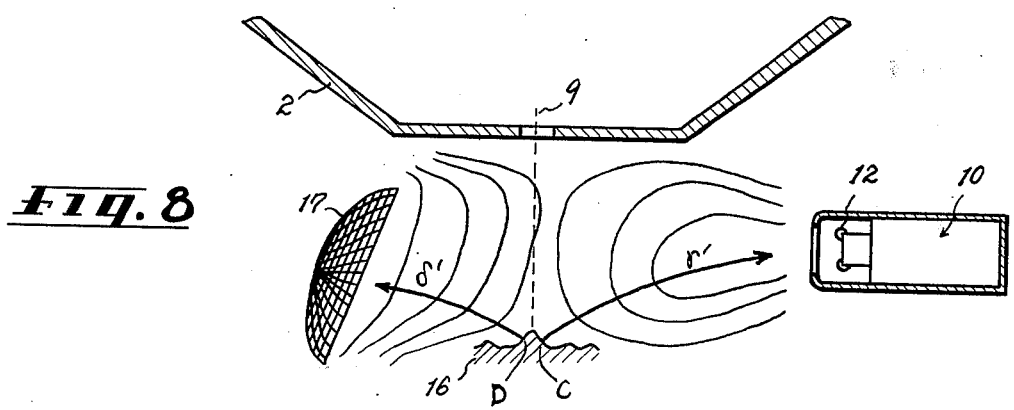
Figure 9:
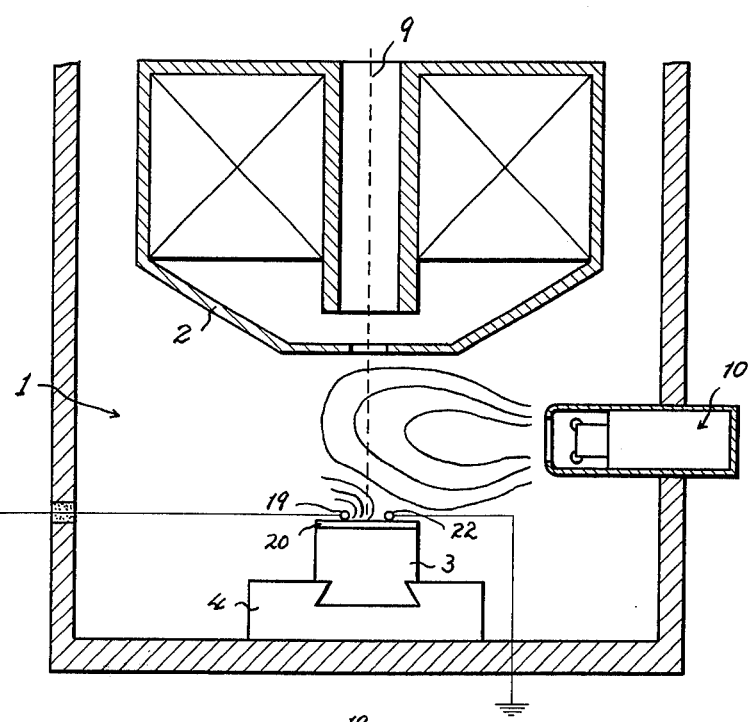
Figure 10:
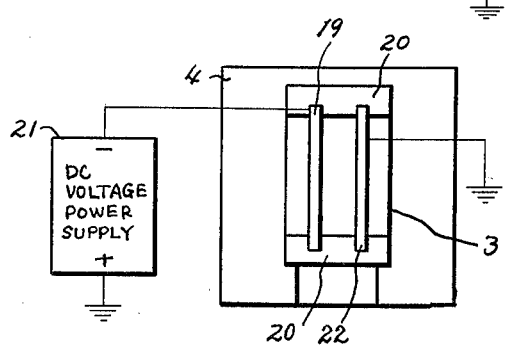

This invention will become more readily apparent by reading through the following detailed description in conjunction with the accompanying drawings of which, FIG. 1 is a sectional view showing one embodiment of this invention, FIG. 2 is a drawing showing a plane view of the essential parts of the embodiment shown in FIG. 1, FIG. 3 is a sectional view showing a conventional type scanning electron microscope, FIG. 4 is a drawing showing a modified version of the composite parts constituting the embodiment shown in FIG. 1, FIGS. 5, 7 and 9 are sectional views of other embodiments of this invention, FIGS. 6 and 8 are schematic diagrams for explaining the principle of the embodiment shown in FIG. 5, and FIG. 10 is a drawing showing a plane view of the essential parts of the embodiment shown in FIG. 9.

Referring to FIG. 1, a specimen chamber 1 forms part of the column of a scanning electron microscope. The final stage 2 of a two-stage condenser lens is shown. A specimen holder 3 is installed on a specimen stage 4. A flat metallic specimen is mounted on the holder 3 but spaced therefrom by a layer of insulating material 6. Moreover, the specimen 5 is electrically connected to the negative side of a d.c. power supply 7, the positive side of which is grounded. The output voltage of the power supply 7 can be varied between −10V and approximately −4kV. A grounded auxiliary electrode 8 is also arranged on the layer of insulating material 6 parallel to and at a distance up to about 50 mm (depending on type of specimen holder used) below the specimen 5. FIG. 2 shows a plane view of the specimen 5 and auxiliary electrode 8 as seen from the condenser lens 2. The primary electron beam 9 irradiates the specimen 5 after being focussed by the condenser lens 2. The resultant secondary electrons emanated from the specimen are detected by a secondary electron detector 10 mounted in the sidewall of the specimen chamber 1. The detector 10 which is equipped with a collector electrode 12 is, except for an opening through which the electrons pass, totally encased in grounded shielding material 11. The electrode 12 is maintained at 10kV in order to accelerate the electrons passing through the said opening.

The distribution of the equipotential lines set up by the electric field are represented as A on FIG. 1. It will be noted that the lines are closely grouped in the immediate vicinity of the specimen indicating that the force set up by the electrical field to which the secondary electrons are subjected is stronger in this region than elsewhere. Accordingly, almost all the secondary electrons emitted from the specimen tend towards the detector 10. Conversely, if we examine FIG. 3 which illustrates the distribution B of the equipotential lines of the field in the case of the apparatus according to the prior art, it is apparent that the intensity of the electric field in the immediate vicinity of the specimen is not stronger than elsewhere in the field. Accordingly, the direction of travel of the emitted secondary electrons is not varied enough as indicated by the arrowed line so that the secondary electrons bypass the detector. $\alpha$ and $\beta$ (FIGS. 1 and 3) represent the orbit of the secondary electrons whose (initial) direction of take-off is not towards the detector 10. It is obvious then that by comparing the two orbital paths, $\alpha$ offers a greater degree of detectability than $\beta$. In other words, the efficiency, in terms of secondary electron detection rate, of the embodiment of this invention described in FIG. 1 is higher than in the case of the apparatus described in the prior art.

In fact, experimentation has demonstrated that the detection rate of the present invention is 200 ~ 300 percent higher than in the case of the prior art.

In the above experiment, a 15kV primary electron beam accelerating voltage was used and the specimen (used as a low potential auxiliary electrode) was maintained at −400 ~ −500V. The increase in the contrast of the scanning image in the magnification range 50×~ 60,000× was experimentally verified.

The intensity and amplitude of the output signal can be varied by either controlling the voltage supplied to the specimen or by tilting the specimen. Moreover, in this invention, although the auxiliary electrode 8 in FIG. 1 is preferably fixed at ground potential, this is not necessary. Generally, the optimum potential, positive or negative, of the specimen and auxiliary electrode is determined by the distribution of the electric field in the specimen chamber. Also, varying the distance between the specimen and auxiliary electrode 8 in order to fulfill various conditions, does not impair the detectability of the apparatus. FIG. 4 shows another configuration (shape) of the specimen 5 and auxiliary electrode 8. Another configuration is also possible.

When handling specimens other than the plate type, the specimen can either be placed on the plate 5 or supported over but near said plate 5 by means of a support mechanism; in either case, the plate would function as an auxiliary electrode.

FIG. 5 shows another embodiment of this invention designed mainly to improve signal contrast by providing an additional plate electrode 13, connected to a power supply 14. This electrode which is resistive is fastened to the underside of the condenser lens pole piece by a layer of adhesive insulating material 15. One end $p$ of the electrode 13, located in the proximity of the primary electron beam or optical axis, is maintained at ground potential, and the other end $q$ of said electrode, located near the detector 10, is maintained at a positive potential by means of the power supply 14. A specimen 16, held in the holder 3 on the stage 4, is also maintained at ground potential.

FIG. 6 shows the distribution of the electric field in the embodiment described in FIG. 5. The unevenness of the specimen is exaggerated for explanatory purposes. When current from the power supply 14 is passed through the electrode 13, the potential difference (in the order of several hundred volts) created between $q$ and $p$ sets up an electric field which supplements that already generated by the collector electrode 12 as shown on the figure. It will be noted that practically all the secondary electrons emanated from the sloping portion C of the specimen surface (i.e., the slope facing the electron detector 10) are detected by said detector, as illustrated by their calculated trajectory $\gamma$; whereas, the vast majority of electrons emanated from the sloping portion D which faces away from the detector remain undetected, since they are drawn towards the electrode 13, as illustrated by trajectory $\delta$. Thus, by equipping an extra electrode, the contrast of the detector output signal is enhanced in accordance with the topographical disposition of each micro-area of the specimen surface.

Figure 7:
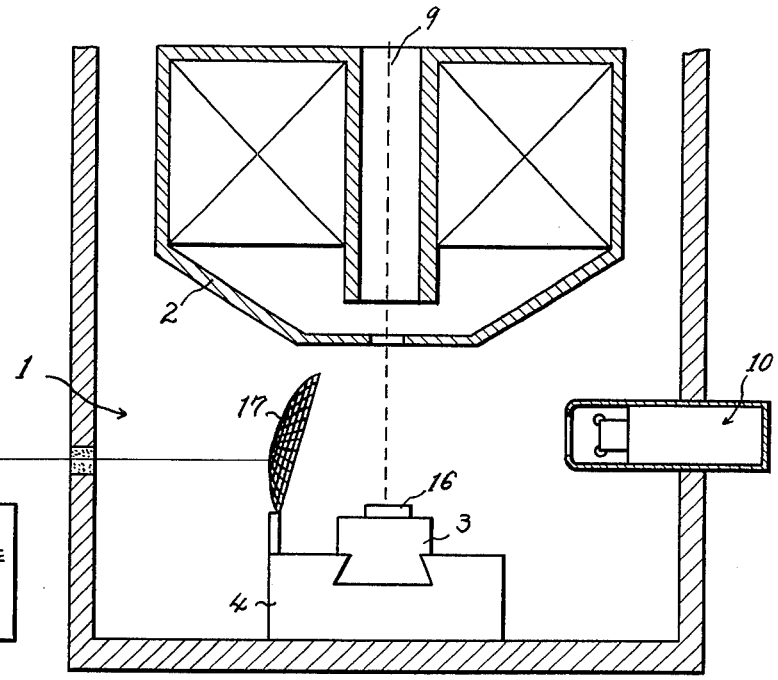

FIG. 7 shows yet another embodiment according to this invention and is designed to achieve the same result as the embodiment described in FIG. 5, namely, to improve the output signal contrast of the electron detector 10. In the figure, 17 is a fully conductive cupola-shaped electrode arranged so as to face the detector 10, the specimen 16 being interposed between said electrode 17 and the electron detector 10. The electrode 17 is maintained at a certain positive potential, for example, 10kV by means of a d.c. power supply 18. A recommended material for electrode 17 would be metal mesh as this would help to reduce background noise caused by the secondary and backscattered electrons rebounding therefrom towards the detector. The electrode, in this case, does not necessarily have to be cupola-shaped, for a rod-shaped or flat plate type electrode would serve equally well. The electric field distribution in the case of this embodiment is shown in FIG. 8. It will be noted, as in the case of the electric field distribution of the embodiment described in FIG. 5 and shown in FIG. 6, that practically all the secondary electrons emanated from the sloping portion C of the specimen surface are detected, as illustrated by their calculated trajectory $\gamma'$; whereas, the vast majority of the electrons emanated from the sloping portion D, which faces away from the detector, remain undetected, since they are drawn towards the electrode 17, as illustrated by trajectory $\delta'$. The effect thus achieved by this embodiment is, to all intents and purposes, the same as that achieved in said former embodiment.

FIG. 9 shows an embodiment suitable for the observation of filament type specimens. In the figure, 19 is an electrically conductive specimen, set on a layer of insulating material 20. The specimen is kept at a negative potential by means of the power supply 21. A grounded auxiliary electrode 22, also filament shaped, is located adjacent and parallel to the specimen 19. FIG. 10 shows the specimen and electrode viewed from the base of lens 2. It will be noted from FIG. 9, that the density of the equipotential lines in the vicinity of the specimen is quite high and that the direction of the electric force generated by the field with respect to the specimen is towards the detector 10. Accordingly, in this embodiment, the detection rate is very high as in the case of embodiment described in FIG. 1.

Having thus described the invention with detail and particularity as required by the patent laws, what is desired protected by Letters Patent is set forth in the following claims:

1. In a device for forming a scanning image by detecting the secondary electrons emanated from a specimen irradiated by a scanning primary electron beam, the improvement comprising
- detecting means comprising an electron detector and a collector electrode maintained at a positive potential,
- at least first and second auxiliary electrodes not including the collector electrode, and
- a d.c. power supply for maintaining said first auxiliary electrode at a lower potential than said second auxiliary electrode, said specimen arranged nearest the first auxiliary electrode
- such that an electric field is created between the specimen and the detector, said electric field directing the secondary electrons emanated from the specimen toward the detector, thereby increasing the output signal intensity thereof.

2. In a device for forming a scanning image by detecting the secondary electrons emanated from a specimen irradiated by a scanning primary electron beam, the improvement comprising a layer of insulating material for isolating the specimen from its holder and at least one auxiliary electrode, a d.c. power supply for maintaining the specimen and at least one auxiliary electrode at different potentials, said specimen being maintained at the lowest potential, and detecting means comprising an electron detector and a collector electrode maintained at a positive potential such that an electric field is created between the specimen and the detector, said electric field directing the secondary electrons emanated from the specimen toward the detector, thereby increasing the output signal intensity thereof.

3. In a device for forming a scanning image by detecting the secondary electrons emanated from a specimen irradiated by a scanning primary electron beam, the improvement comprising an electrically resistive auxiliary electrode arranged immediately below the final stage condenser lens pole piece, a d.c. power supply for energizing said auxiliary electrode to create a potential difference between the two ends of the electrode such that an electric field is created between the specimen, arranged at the lower potential end of the electrode, and a detecting means comprising an electron detector and a collector electrode maintained at positive potential such that secondary electrons emanated from the specimen in the general direction of the detectors are directed toward said detecting means increasing the output signal intensity thereof.

4. In a device for forming a scanning image by detecting the secondary electrons emanated from a specimen irradiated by a scanning primary electron beam, the improvement comprising a detecting means comprising an electron detector and a collector electrode, an auxiliary electrode arranged near the specimen but opposite the detecting means, said auxiliary electrode being maintained at a positive potential such that an electric field is created between the specimen and the detector which directs secondary electrons emanated from the specimen in the general direction of the detector to the detector but gathers electrons emanated in the general direction of the electrode, thereby increasing the output signal of the detector and providing increased scanning image contrast.

* * * * *

UNITED STATES PATENT OFFICE
CERTIFICATE OF CORRECTION

PATENT NO. : 4,011,450
DATED : March 8, 1977
INVENTOR(S) : Takashi Tagawa et al.

It is certified that error appears in the above-identified patent and that said Letters Patent are hereby corrected as shown below:

Column 2 Line 7

After "accelerated" insert --at an accelerating--.

Signed and Sealed this

Third Day of May 1977

[SEAL]

Attest:

RUTH C. MASON
Attesting Officer

C. MARSHALL DANN
Commissioner of Patents and Trademarks